(12) United States Patent
Li et al.

(10) Patent No.: US 10,367,128 B2
(45) Date of Patent: Jul. 30, 2019

(54) PIXEL STRUCTURE AND METHOD FOR THE FABRICATION THEREOF

(71) Applicant: Shenzhen China Star Optoelectronics Technology Co., Ltd., Shenzhen, Guangdong (CN)

(72) Inventors: Dongze Li, Guangdong (CN); Lixuan Chen, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 64 days.

(21) Appl. No.: 15/525,986

(22) PCT Filed: May 10, 2017

(86) PCT No.: PCT/CN2017/083689
§ 371 (c)(1),
(2) Date: May 11, 2017

(87) PCT Pub. No.: WO2018/176583
PCT Pub. Date: Oct. 4, 2018

(65) Prior Publication Data
US 2018/0315909 A1      Nov. 1, 2018

(51) Int. Cl.
*H01L 33/62*      (2010.01)
*H01L 25/075*     (2006.01)
*H01L 33/60*      (2010.01)

(52) U.S. Cl.
CPC .......... *H01L 33/62* (2013.01); *H01L 25/0753* (2013.01); *H01L 33/60* (2013.01); *H01L 2933/0058* (2013.01); *H01L 2933/0066* (2013.01)

(58) Field of Classification Search
CPC .... H01L 27/156; H01L 33/0095; H01L 33/60
See application file for complete search history.

(56) References Cited

U.S. PATENT DOCUMENTS 9,035,279 B2 *   5/2015   Hu ........................ H01L 33/08
                                                              257/13
2016/0372514 A1   12/2016   Chang et al.

FOREIGN PATENT DOCUMENTS

| CN | 1877875 A | 12/2006 |
| CN | 101866075 A | 10/2010 |
| CN | 105976725 A | 9/2016 |
| CN | 106229394 A | 12/2016 |
| JP | H04163455 A | 6/1992 |

* cited by examiner

*Primary Examiner* — Sonya D. McCall-Shepard
(74) *Attorney, Agent, or Firm* — Andrew C. Cheng

(57) ABSTRACT

The present application discloses a pixel structure and method for the fabrication thereof including: providing a substrate; forming a black photoresist layer having a receiving cavity and an isolation region on the substrate; coating a polyelectrolyte solution on the surface of the black photoresist layer except the isolation region, and air-dried to form a polyelectrolyte layer; coating a metal nanoparticle solution on the surface of the polyelectrolyte layer, and air-dried to form a metal particle layer; and aligning and transferring a micro light emitting diodes to the black photoresist layer. In the above-described manner, the present disclosure can improve the light utilization efficiency of the micro light emitting diode.

6 Claims, 1 Drawing Sheet

PIXEL STRUCTURE AND METHOD FOR THE FABRICATION THEREOF

FIELD OF THE INVENTION

The present application relates to a display technology field, and more particularly to a pixel structure and method for the fabrication thereof.

BACKGROUND OF THE INVENTION

With the rapid development of display technology, the applications of the micro light emitting diode, Micro LED display are also attracting more and more attention by the industry. Micro LEDs are self-luminous units driven by current, each of the independent light emitting units is uniformly illuminated in all directions in the space, so that most of the light energy is lost during this process.

SUMMARY OF THE INVENTION

The present disclosure provides a pixel structure and a method for the fabrication thereof, and can improve the utilization ratio of micro light-emitting diodes.

In order to solve the above technical problems, a technical proposal adopted by the present disclosure is to provide a pixel structure, the pixel structure includes: a substrate; a black photoresist layer deposited on the substrate, the black photoresist layer including a receiving cavity and an isolation region, and the isolation region is provided in the receiving cavity; a polyelectrolyte layer, the polyelectrolyte layer is coated on the black photoresist layer except the isolation region; a metal nanoparticle layer, the metal nanoparticle layer is covered on the polyelectrolyte layer; a micro light emitting diode, the micro light emitting diode is disposed on the isolation region; wherein the metal nanoparticle including at least one of Au, Ag, Cu, Ni, Co, Pt and/or an alloy formed by at least two of Au, Ag, Cu, Ni, Co and Pt; and the polyelectrolyte layer including at least one of Poly Diallyl Dimethyl Ammonium Chloride, Sodium Polyacrylate, Poly Dimethyl Diallyl Ammonium Chloride, and Acrylic Acid-Vinylpyridine Copolymer.

In order to solve the above technical problems, another technical solution adopted by the present disclosure is that providing a substrate; forming a black photoresist layer having a receiving cavity and an isolation region on the substrate; coating a polyelectrolyte solution on the surface of the black photoresist layer except the isolation region, and air-drying to form a polyelectrolyte layer; coating a metal nanoparticle solution on the surface of the polyelectrolyte layer, and air-drying to form a metal particle layer; and aligning and transferring a micro light emitting diodes to the black photoresist layer.

In order to solve the above-mentioned technical problems, a further technical solution adopted by the present disclosure is to provide a pixel structure, including: a substrate; a black photoresist layer deposited on the substrate, the black photoresist layer including a receiving cavity and an isolation region, and the isolation region is provided in the receiving cavity; a polyelectrolyte layer, the polyelectrolyte layer is coated on the black photoresist layer except the isolation region; a metal nanoparticle layer, the metal nanoparticle layer is covered on the polyelectrolyte layer; and a micro light emitting diode, the micro light emitting diode is disposed on the isolation region.

An advantageous effect of the present disclosure is that, comparing to the conventional technology, the present disclosure can improve the light utilization efficiency of the micro light emitting diode by forming a pixel structure having a reflective layer.

BRIEF DESCRIPTION OF THE DRAWINGS

In order to more clearly illustrate the embodiments of the present application or conventional technology, the following FIGS. will be described in the embodiments are briefly introduced. It is obvious that the drawings are merely some embodiments of the present application, those of ordinary skill in this field can obtain other FIG.s according to these FIG.s without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

Figure 1:
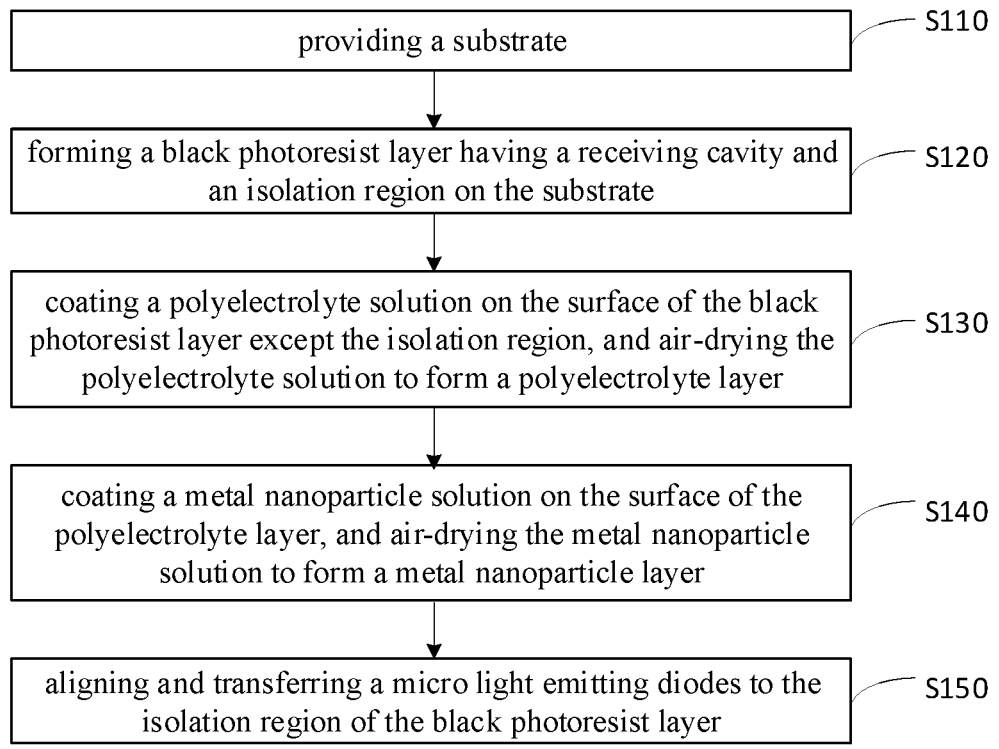
FIG. 1 is a flow diagram of an embodiment of the method for the fabrication of the pixel structure of the present disclosure.

Referring to FIG. 1, FIG. 1 illustrates the method for the fabrication of the pixel structure of an embodiment of a pixel structure of the present disclosure, the method including the steps of: S110, preparing a substrate.

Wherein the substrate can be a transparent material, specifically it can be glass or transparent plastic etc.

S120, forming a black photoresist layer having a receiving cavity and an isolation region on the substrate.

In step S120, the black photoresist layer having the receiving cavity and the isolation region can be formed by adapting photolithography process in one step. Wherein, the black photoresist layer is an organic compound, after being exposed to ultraviolet light, the solubility in the developer will be changed. The photoresist is coated on the surface of the substrate in a liquid state generally, and is baked into a solid state after exposure. The effect is to transfer the pattern on the mask to the oxide layer on the surface of the substrate, so as to protect the following material such as etching or ion implantation, etc.

The photolithography refers to a process in which a specific portion of the photoresist layer on the surface of the substrate is removed by a series of fabricating steps, after which the photoresist layer with a micro pattern structure is left on the surface of the substrate. By the photolithography process, a feature pattern portion is retained on the surface of the substrate finally. And the three basic elements of the photolithography process is to control the light (mainly ultraviolet light), mask and photoresist.

In the present embodiment, the black photoresist layer having the receiving cavity and the isolation region can be formed by adapting photolithography process in one step. In other embodiments, the black photoresist layer can also be formed by photolithography in two steps, i.e., a black photoresist layer having a receiving cavity structure is formed first, and the isolation region is further formed in the receiving cavity. Wherein the isolation region can be arranged in a structure such as a projection, a recess or a groove, and the subsequently provided polyelectrolyte solution and the metal nanoparticle solution are not coated on the isolation region, so as to isolate the pins at both ends of the micro light emitting diode, so that the micro light emitting diode is not short. In the present embodiment, the isolation region is provided as a projection structure to facilitate the placement of the micro light emitting diodes. S130, the surface of the black photoresist layer except the isolation region is coated with the polyelectrolyte solution, and then be air-dried to form a polyelectrolyte layer.

In step S130, the coating of the polyelectrolyte layer and the subsequent film layer structure is performed using a layer-by-layer, LBL technique. The layer-by-layer technique is using the method of alternating layers deposition, by the weak interaction function between intermolecular of each of the layers, such as electrostatic attraction, hydrogen bonds, coordination keys, etc., so that the layers and layers are spontaneously associated with the formation process of a complete structure, stable performance, molecular aggregates or supramolecular structure with a specific function. In the present embodiment, the electrostatic layer-by-layer technique is mainly used, such as the electrostatic interaction between ions is used as the driving force for film formation. The polyelectrolyte layer is formed by air-drying the polyelectrolyte solution coated on the uniformly coated black photoresist layer having the receiving cavity and the isolation region obtained by the above mentioned photolithography process. Wherein, the polyelectrolyte solution can be selected from one of Poly Diallyl Dimethyl Ammonium Chloride, Sodium Polyacrylate, Poly Dimethyl Diallyl Ammonium Chloride, and Acrylic Acid-Vinylpyridine Copolymer. In a specific embodiment, the polyelectrolyte solution is selected from a solution of Poly Dimethyl Diallyl Ammonium Chloride, PDDA at a concentration of 2 mg/ml, and during the coating process, the structure of the isolation region of the black photoresist layer is avoided. After air dried by the air knife, a Poly Dimethyl Diallyl Ammonium Chloride film layer is formed, such is the polyelectrolyte layer.

S140, coating and air-drying a metal nanoparticles solution on the surface of the polyelectrolyte layer to form a metal particle layer.

In step S140, a metal nanoparticle solution is further coated on the polyelectrolyte layer.

Wherein the metal nanoparticle solution can include at least one of Au, Ag, Cu, Ni, Co, Pt and/or an alloy formed by at least two of Au, Ag, Cu, Ni, Co and Pt. The selected metal nanoparticle solution should have a high extinction coefficient, the so-called extinction coefficient is amount of the absorption of light of the measured solution. In the present embodiment, the Ag nanoparticle solution is selected as the metal nanoparticle solution and coated on the polyelectrolyte layer and air-dried to form an Ag nanoparticle layer. That is, the Ag nanoparticle layer is used as a reflective layer. When the light beam is incident from the air to the surface of the Ag nanoparticle layer, the light amplitude entering the Ag nanoparticle layer is rapidly attenuated, so that the amount of light entering the Ag nanoparticle layer is reduced, while the reflected light energy is increased. And the extinction coefficient of the selected metal particle solution is higher, the more the attenuation of the light amplitude is, the less the light energy entering the metal is, and the higher the reflectance is.

Besides, in step S130 and step S140, the polyelectrolyte solution and the metal nanoparticle solution are electrically opposite to each other, that is, in step S130, the polyelectrolyte solution is selected as a cationic Poly Dimethyl Diallyl Ammonium Chloride, and in step S140, the metal nanoparticle solution is selected as an Ag nanoparticles solution with a negatively charged. In other embodiments, the polyelectrolyte solution and the metal nanoparticle solution can be selected as long as they meet the opposite electrical properties. And the use of layer-by-layer technique and alternately depositing technique can control the structure and thickness of the assembly film layers. In a specific embodiment, if it is necessary to increase the thickness of the metal nanoparticle layer, the above steps S130 and S140 can be repeated, i.e., one layer of the polyelectrolyte solution is further coated on the metal nanoparticle layer to form a polyelectrolyte layer, and a metal nanoparticle solution is coated and air-dried on the polyelectrolyte layer to form one metal nanoparticle layer, so that the desired thickness of film layer can be obtained by repeating the above steps.

S150, the micro light emitting diodes are aligned and transferred to the black photoresist layer.

The micro light emitting diodes are aligned and transferred to the black photoresist layer after the formation of the desired thickness of the metal nanoparticle layer by the layer-by-layer technique and alternately depositing technique. Specifically, the micro light emitting diodes are aligned and transferred to the isolation region structure of the black photoresist layer.

Wherein, the micro light emitting diode is the use of mature light emitting diode manufacturing process to form micro light emitting diode units with the size of 10~50 um grown on the sapphire substrate by the molecular beam epitaxy in large scale. For forming patterned micro light emitting diodes with different color to constitute a display area, the transferring technology through high precision to transfer to the glass substrate is needed. Since the size of the sapphire substrate for fabricating the micro light emitting diodes is essentially the size of the silicon wafers, and the glass substrate with much larger size is used for fabricating the display apparatus, it is necessary to perform multiple transferring, in which the transferring of the micro light emitting diodes is required a special transferring tool, the function of the transferring tool is to align and transfer the micro light emitting diodes from the sapphire substrate to the isolation region of the black photoresist layer, the process can be simply described as: first, contacting the transfer tool with the micro light emitting diode, applying a voltage to the transfer tool and generate a clamping pressure to the micro light emitting diode, picking up the micro light emitting diode with a transfer tool, making the isolation region structure of the black photoresist layer contacting with the micro light emitting diode, and finally releasing the micro light emitting diode to the isolation region structure.

Further, after the micro light emitting diodes are aligned and transferred to the isolation region structure of the black photoresist layer, due to the optical characteristics of the above-mentioned metal nanoparticle layer, it can make the light emitted from the micro light emitting diodes to the circumferential direction to converge to the light emitting direction again by the refraction and reflection, reduce the light loss and improve the light utilization rate. In the above embodiment, it is possible to improve the light utilization efficiency of the micro light emitting diode by using a layer-by-layer technique to form a pixel structure having a reflective layer.

Figure 2:
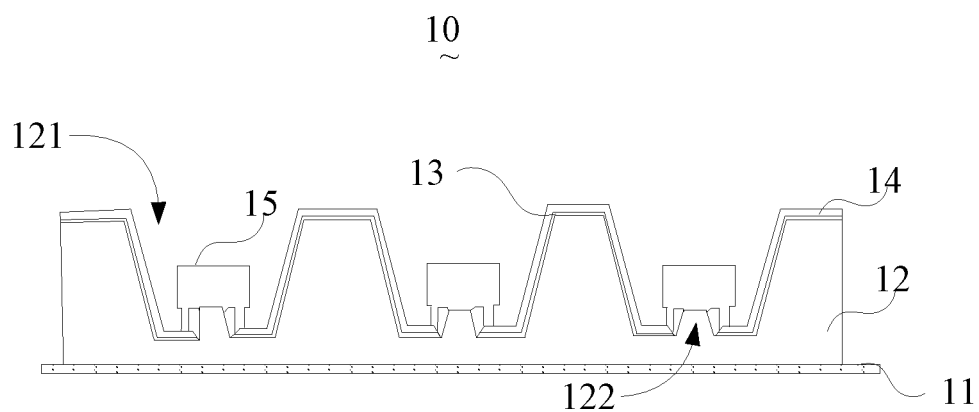
FIG. 2 is a schematic structural view of an embodiment of the pixel structure of the present disclosure.

Referring to FIG. 2, FIG. 2 is a schematic structural view of an embodiment of the pixel structure of the present disclosure. As illustrated in FIG. 2, the pixel structure 10 includes: a substrate 11, a black photoresist layer 12, a polyelectrolyte layer 13, a metal nanoparticle layer 14, and a micro light emitting diode 15.

Wherein, the substrate 11 can be a transparent material, specifically, glass or transparent plastic or the like.

The black photoresist layer 12 is deposited on the substrate 11, and the black photoresist layer 12 includes the receiving cavity 121 and the isolation region 122, and the isolation region 122 is provided in the receiving cavity 121. Specifically, the black photoresist 12 is an organic compound, after being exposed to ultraviolet light, the solubility in the developer will be changed. The photoresist is coated on the surface of the substrate in a liquid state generally, and is baked into a solid state after exposure. The effect is to transfer the pattern on the mask to the oxide layer on the surface of the substrate 11, so as to protect the following material such as etching or ion implantation, etc. the black photoresist layer 12 can be formed by adapting photolithography process in one step, it can also be formed by photolithography in two steps, i.e., the black photoresist layer 12 having a receiving cavity 121 structure is formed first, and the isolation region 122 is further formed in the receiving cavity 121. Wherein the isolation region 122 can be arranged in a structure such as a projection, a recess or a groove, and the subsequently provided polyelectrolyte solution and the metal nanoparticle solution are not coated on the isolation region 122, so as to isolate the pins at both ends of the micro light emitting diode 15, so that the micro light emitting diode 15 is not short. In the present embodiment, the isolation region 122 is provided as a projection structure to facilitate the placement of the micro light emitting diodes 15.

The polyelectrolyte layer 13 is coated on the black photoresist layer 12 except the isolation region 122. Wherein, the polyelectrolyte layer 13 can be one of the Poly Diallyl Dimethyl Ammonium Chloride, Sodium Polyacrylate, Poly Dimethyl Diallyl Ammonium Chloride, and Acrylic Acid-Vinylpyridine Copolymer. In a specific embodiment, the polyelectrolyte layer 13 is selected of Poly Dimethyl Diallyl Ammonium Chloride.

The metal nanoparticle layer 14 is covered on the polyelectrolyte layer 13, the metal nanoparticle includes at least one of Au, Ag, Cu, Ni, Co, Pt and/or an alloy formed by at least two of Au, Ag, Cu, Ni, Co and Pt. The selected metal nanoparticle layer should have a high extinction coefficient. In the present embodiment, the Ag nanoparticle layer is selected as the reflective layer. When the light beam is incident from the air to the surface of the Ag nanoparticle layer, the light amplitude entering the Ag nanoparticle layer is rapidly attenuated, so that the amount of light entering the Ag nanoparticle layer is reduced, while the reflected light energy is increased. And the extinction coefficient of the selected metal particle solution is higher, the more the attenuation of the light amplitude is, the less the light energy entering the metal is, and the higher the reflectance is.

In the specific embodiment, the polyelectrolyte layer 13 and the metal nanoparticle layer 14 are electrically opposite to each other, that is, the Poly Dimethyl Diallyl Ammonium Chloride thin film layer carries positive charge, the Ag nanoparticle layer carries negatively charge. The two layers are alternately deposited by electrostatic interaction to achieve the desired thickness of the metal nanoparticle film layer. In other embodiments, the polyelectrolyte layer and the metal nanoparticle layer may be selected so long as they satisfy the opposite electrical properties.

The micro light emitting diodes 15 are disposed on the isolation region 122. Wherein, the micro light emitting diode 15 is the use of mature light emitting diode manufacturing process to form micro light emitting diode units with the size of 10~50 um grown on the sapphire substrate by the molecular beam epitaxy in large scale. And it is disposed on the isolation region 122 of the black photoresist layer 12 by a align and transfer, and the specific fabricating method is described above, and will not be described here. Due to the optical characteristics of the above-mentioned metal nanoparticle layer, it can make the light emitted from the micro light emitting diodes to the circumferential direction to converge to the light emitting direction again by the refraction and reflection, reduce the light loss and improve the light utilization rate.

In view of the foregoing, it will be readily understood by those skilled in the art that the present disclosure provides a pixel structure and a method for fabricating therefor can improve the light utilization efficiency of the micro light emitting diode by using a layer-by-layer technique to form a pixel structure having a reflective layer.

Above are embodiments of the present application, which does not limit the scope of the present application. Any modifications, equivalent replacements or improvements within the spirit and principles of the embodiment described above should be covered by the protected scope of the invention.

What is claimed is:

1. A method for fabricating a pixel structure for improving the utilization ratio of micro light emitting diodes, comprising:
    providing a substrate;
    forming a black photoresist layer having a receiving cavity and an isolation region on the substrate;
    coating a polyelectrolyte solution on the surface of the black photoresist layer except the isolation region, and air-drying the polyelectrolyte solution to form a polyelectrolyte layer;
    coating a metal nanoparticle solution on the surface of the polyelectrolyte layer, and air-drying the metal nanoparticle solution to form a metal nanoparticle layer; and
    aligning and transferring a micro light emitting diodes to the isolation region of the black photoresist layer.

2. The method for fabricating the pixel structure according to claim 1, wherein the black photoresist layer is formed by adapting photolithography process in one step.

3. The method for fabricating the pixel structure according to claim 1, wherein the black photoresist layer is formed by adapting photolithography process in two step.

4. The method for fabricating the pixel structure according to claim 1, wherein the polyelectrolyte layer and the metal nanoparticle layer are electrically opposite to each other.

5. The method for fabricating the pixel structure according to claim 1, wherein the metal nanoparticle comprising at least one of Au, Ag, Cu, Ni, Co, Pt and/or an alloy formed by at least two of Au, Ag, Cu, Ni, Co and Pt.

6. The method for fabricating the pixel structure according to claim 1, wherein the polyelectrolyte layer comprising at least one of Poly Dially Ammonium Chloride, Sodium Polyacrylate, Poly Dimethyl Dially Ammonium Chloride, and Acrylic AcidVinylpyridine Copolymer.

* * * * *